United States Patent [19]

Hirata et al.

[11] Patent Number: 4,868,638
[45] Date of Patent: Sep. 19, 1989

[54] PLASTIC MOLDED PIN GRID CHIP CARRIER PACKAGE

[75] Inventors: Atsuomi Hirata, Nara; Yoshihiko Nakamura, Nishinomiya; Kensaku Morii, Takatsuki, all of Japan

[73] Assignee: Matsushita Electric Works, Ltd., Osaka, Japan

[21] Appl. No.: 121,506

[22] Filed: Nov. 13, 1987

[30] Foreign Application Priority Data

Nov. 15, 1986 [JP] Japan ................................. 61-272190
Nov. 15, 1986 [JP] Japan ................................. 61-272191

[51] Int. Cl.[4] ...................... H01L 23/48; H01L 23/12
[52] U.S. Cl. ...................................... 357/72; 357/74
[58] Field of Search ................ 357/80, 70, 68, 74; 174/52 FP; 176/68.5

[56] References Cited
U.S. PATENT DOCUMENTS

| 4,326,214 | 4/1982 | Trueblood | 357/80 |
| 4,338,621 | 7/1982 | Braun | 357/80 |
| 4,530,002 | 7/1985 | Kanai | 357/68 |
| 4,618,739 | 10/1986 | Theobald | |
| 4,700,473 | 10/1987 | Freyman et al. | 174/68.5 |
| 4,723,156 | 2/1988 | Okuaki | 357/72 |

FOREIGN PATENT DOCUMENTS

| 0039160 | 11/1981 | European Pat. Off. | |
| 59-107551 | 6/1984 | Japan | |
| 60-55648 | 3/1985 | Japan | |
| 0174752 | 8/1986 | Japan | 357/74 |
| 2136205 | 9/1984 | United Kingdom | |

OTHER PUBLICATIONS

"Eighty-Pin Package for Field-Effect Transistor Chips"-Honn-IBM Technical Disclosure Bulletin-vol. 15-No. 1, 6-1972, p. 308.
"Flanged Pin MC Substrate Design"-Funari et al., IBM Tech. Disclosure-vol. 21, No. 1-6-1978, pp. 94-95.
IBM Technical Disclosure-vol. 15, No. 3-Aug. 1972--Connector Interposer for Module to Board Elec. Interconnection-Agard et al.—p. 912.
Solid State Technology, vol. 25, No. 6, Jun. 1982, pp. 94-100.
Electronics, Mar. 17, 1987, pp. 81-91.
IBM Technical Disclosure Bulletin, vol. 21, No. 8, Jan. 1979, p. 3120.

Primary Examiner—Rolf Hille
Assistant Examiner—S. V. Clark
Attorney, Agent, or Firm—Armstrong, Nikaido, Marmelstein, Kubovcik & Murray

[57] ABSTRACT

An improved plastic molded chip carrier package for a semiconductor chip has a plurality of I/O pins arranged on a pin grid array. The pin grid array comprises at least two rows of the I/O pins disposed along the sides of the chip in such a manner that the I/O pins are staggered with respect to those in the other row. The staggered arrangement of the I/O pins makes it easy to provide electrical interconnection between the I/O ports on the chip and the corresponding I/O pins without requiring an elaborate or crowded wiring or connection lines. This is particularly effective when an increased number of the I/O pins are required to be included in the limited area of the chip carrier.

6 Claims, 5 Drawing Sheets

PLASTIC MOLDED PIN GRID CHIP CARRIER PACKAGE

BACKGROUND OF THE INVENTION

1. Field of the Invention

The present invention is directed to a plastic molded pin grid chip carrier package, and more particularly to a plastic molded chip carrier package having an increased number of I/O pins arranged in a pin grid array.

2. Description of the Prior Art

Pin grid array packages for semiconductor chips have been widely accepted in the art to replace ceramic packages for their feasibility of incorporating a plurality of I/O pins at the time of molding the package and for thermal compatibility with a conventional printed-circuit boards on which the packages are frequently required to be directly mounted. Such pin grid array plastic packages have been proposed, for example, in U.S. Pat. No. 4,618,739 in which a chip carrier is molded from a suitable plastic material to integrally include a plurality of I/O pins.

Now that there is an increasing industry demand to utilize more sophisticated integrated chips provided with a greater number of I/O ports, the conventional pin grid array configuration as in the above patent will encounter a critical problem when adding or increasing the number of I/O pins while retaining the pin density as high as possible to prevent the package from becoming too large. The problem is that, as the number of rows on the pin grid is increased to give a greater number of I/O pins in compliance with the increased I/O ports on the chip but without substantially increasing the pin pitch in each row, the electrical interconnection between the I/O ports on the chip and the individual I/O pins requires an elaborate wiring or connection technique, which is rather difficult to be realized on the pin grid array even with a standard pin pitch of 100 mil. That is, when the package is intended to have a plurality of rows on the pin grid in each of which the pins are closely spaced, it is very likely that the wires or connection lines extending from the I/O pins in the inner row of the pin grid cross or intersect with those from the outer row of the pin grid, making the electrical connection totally unreliable. With this result, the prior pin grid array package has a certain limitation on increasing the number of rows on the pin grid array, making the package unsatisfactory when it is required to further increase the number of I/O pin without substantially increasing the pin pitch.

SUMMARY OF THE INVENTION

The above problem is eliminated in the present invention which includes a carrier member made of a plastic material with a rectangular chip recess for mounting an integrated circuit chip and a plurality of I/O pins each having its top end portion integrally embedded into the carrier member outwardly of the chip recess and protruding downwardly from the carrier member. The characterizing feature of the present invention resides in that the I/O pins are arranged in plural rows in such a manner that the I/O pins in each of the rows are uniformly spaced apart along the sides of said chip recess and are uniformly staggered with respect to the I/O pins in the adjacent row. Due to the staggered arrangement of the I/O pins, no more than one I/O pin in one row is located along any given spacing between the two I/O pins in the adjacent row, whereby it can be readily connected to a corresponding port of the chip by means of a wire element or connection line which can be free from crossing with those routed from the two I/O pins in the adjacent row. Thus, the wire elements or connection lines can be successfully routed without crossing the others, enabling an increased terminal count in the limited area of the chip carrier package while eliminating the unacceptable crossing of the wire elements or the connection lines. With this result, a usual interconnection technique can be enough even for the increased number of I/O pins rather than depending upon an elaborate interconnection technique.

Accordingly, it is a primary object of the present invention to provide a plastic molded chip carrier package which can have an increased number of I/O pins within a limited area, yet requiring no elaborate electrical interconnection between the I/O pins and the chip. In the present invention, two versions of the packages are disclosed, one utilizing wire elements and the other a plastic substrate with a trace pattern of conductor lines for electrical interconnection between the I/O pins and the corresponding I/O ports on the chip. In the former version, therefore, the above staggered arrangement of the I/O pins allows the interconnection to be easily made by usual wire bonding technique. In the latter version, it is possible to design a rather simple pattern of the conductor lines on the plastic substrate by the use of the staggered arrangement.

The latter version also discloses an advantageous feature in which each of the I/O pins is mounted in the carrier member with its top recessed from the top surface of the carrier member so as to form thereat a solder pit for receiving solder by which the I/O pin is electrically connected to the corresponding conductor line on the plastic substrate. Thus, the solder is retained in the individual pits and is prevented from accidentally flowing to the non-target lines or I/O pins, improving the reliability in the electrical connection therebetween.

It is therefore another object of the present invention to provide a plastic molded chip carrier package in which the I/O pins can be suitably soldered to the corresponding conductor lines within the solder pits formed in the carrier member.

Preferably, the conductor lines of the plastic substrate are each formed with a solder bump which fits in the solder pit of the carrier member prior to the reflow soldering thereof to the corresponding I/O pins. The solder pits, therefore, serve to properly register the solder bump with the corresponding I/O pins, in addition to retaining the solder therein for preventing it from reaching the non-target lines.

It is therefore a further object of the present invention to provide a plastic molded chip carrier package in which the plastic substrate with a pattern of conductor lines can be properly registered on the carrier member by better utilization of the soldering pits formed in the carrier member.

The plastic substrate is preferably formed from a thermosetting plastic material of inherently high thermal resistance so that it can be kept unaffected at the time of soldering the conductor lines to the I/O pins and also at the time of soldering the I/O pins to the circuit on a circuit board on which the package is mounted.

In the present invention, there is disclosed another feature in which a transparent material is used to seal the chip and its electrical connection to the I/O pins. This is most advantageous when it is required to expose the chip to light or ultraviolet light after encapsulating the chip as in the case where a semiconductor chip such as a CCD or EPROM is utilized as the chip.

These and still other objects and advantages will be more apparent from the following description of the embodiments when taken in conjunction with the attached drawings.

DESCRIPTION OF THE PREFERRED EMBODIMENTS

Figure 1:
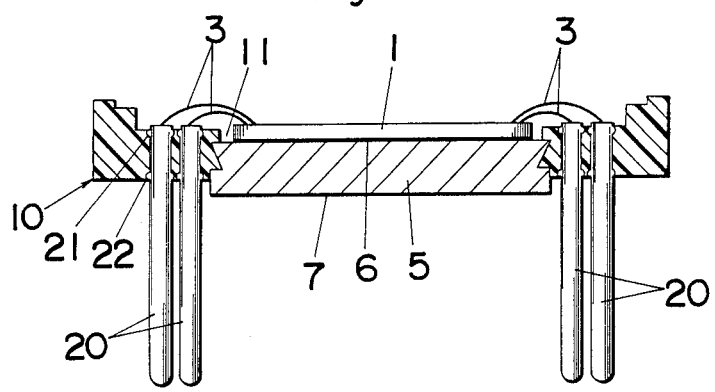
FIG. 1 is a cross sectional view of a plastic chip carrier package in accordance with a first preferred embodiment of the present invention.

First embodiment [FIGS. 1 TO 6]Referring now to FIG. 1, there is shown a molded plastic chip carrier package in accordance with a first preferred embodiment of the present invention. The package comprises a flat shaped carrier member 10 having a center recess 11 for mounting therein a semiconductor chip 1, a plurality of I/O pins 20 arranged on a pin grid to extrude from the bottom surface of the carrier member 10. The carrier member 10 is molded from a suitable heat resistive thermoplastic or thermosetting plastic material into a flat rectangular configuration by a conventional injection or transfer molding technique. Suitable heat-resistive thermoplastic material includes polyphenylene sulphide, polysulphone, polyethersulphone, and polyarylsulphone. Suitable thermosetting plastic material includes phenol, polyimide, and epoxy resins.

Figure 2:
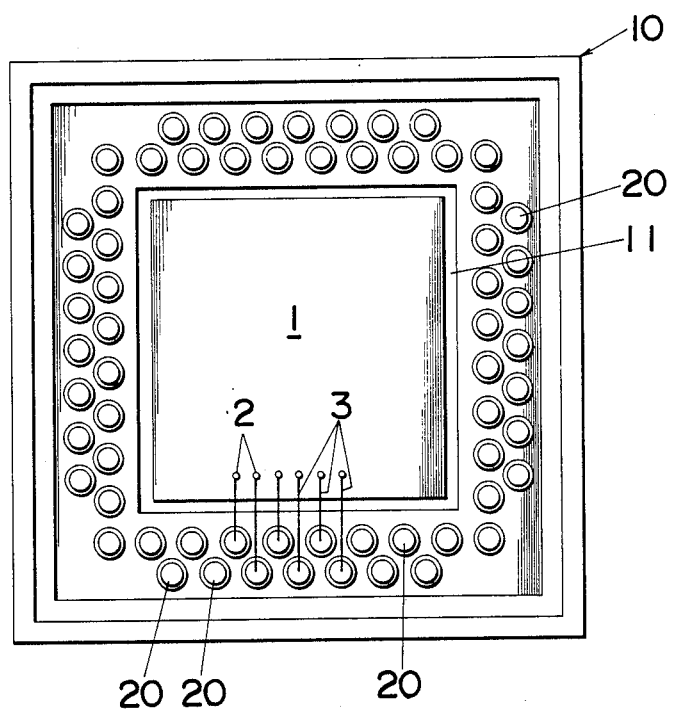
FIG. 2 is a top view of the above package.

The I/O pins 20 are molded in the carrier member 10 with their top ends projected slightly above the top surface thereof and present a pin grid array arranged in the peripheral portion of the carrier member 10 outwardly of the rectangularly shaped center recess 11. Each of the I/O pins 20 has a pair of spaced shoulders 21 and 22 on its top portion both of which are anchored in the molded carrier member 10 for enhanced mechanical bonding strength thereto. As shown in FIG. 2, the pin grid array comprises two rows of the I/O pins 20 arranged on each of the four sides of the carrier member 10. The I/O pins 20 in each row are spaced on 100-mil centers and staggered with respect to those in the adjacent row so that only one of the I/O pins 20 in one row is located along the spacing between the two adjacent I/O pins 20 in the other row.

Each of the I/O pins 20 is electrically interconnected to the individual pads or I/O ports 2 on the chip 1 by a wire element 3 utilizing a known wire bonding technique. It is noted at this point that because of the staggered arrangement of the I/O pins 20, the wire elements 3 can be directed substantially straight from the I/O pins 20 to the corresponding pads 2 so as to avoid crossing of the wire elements 3, giving rise to easy and reliable wireability, which is most desirable when the carrier member 10 includes an increased number of I/O pins 20.

Figure 3:
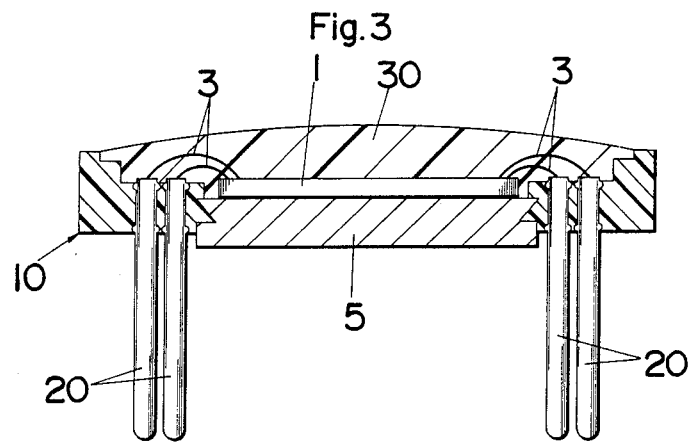
FIG. 3 is a cross sectional view of the package in its encapsulated condition.
Figure 4:
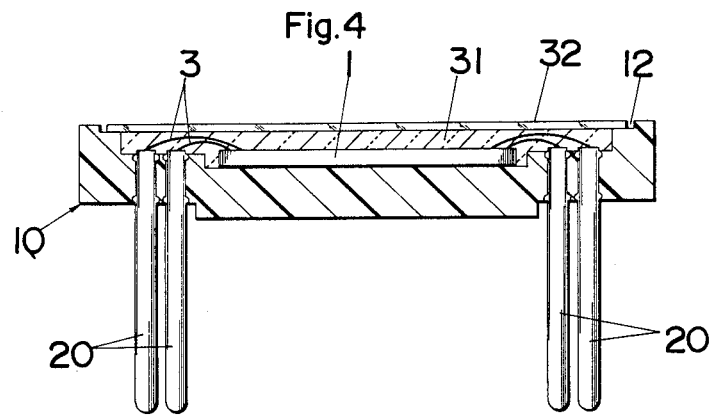
FIGS. 4 and 5 are cross sectional views respectively of modifications of the above package.
Figure 5:
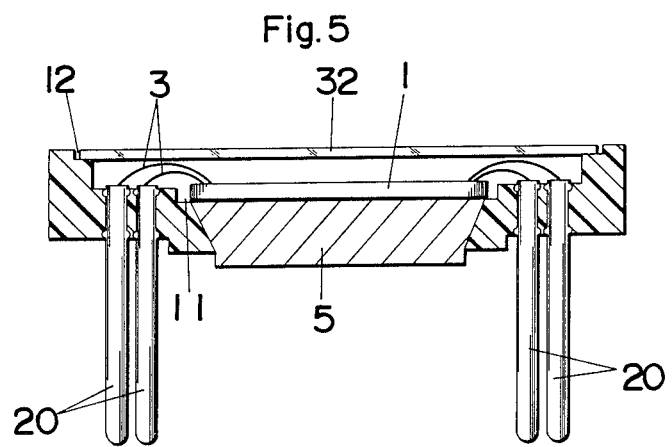

Also molded in the carrier member 10 is a flat-shaped heat sink member 5 having a top chip mounting surface 6 and a bottom heat radiation surface 7. The heat sink member 5 is embedded within the carrier member 10 with its top surface 6 defining the bottom surface of the center recess 11 of the carrier member 10 and with the bottom heat radiation surface 7 exposed to the bottom surface of the carrier member 10. The heat sink member 5 may be made of aluminum, copper, steel, ceramics or any other material having a greater thermal conductivity than the plastic material for the carrier member. After completion of the wire bonding, a suitable encapsulating material 30 is filled on the carrier member 10 to hermetically seal the chip 1 and its electrical connection to the I/O pins 20, as shown in FIG. 3. The encapsulating material may be any conventional resins such as a silicon resin and epoxy resin. When the chip 1 comprises a CCD (charged coupled device) or EPROM (erasable and programmable read-only-memory) requiring exposure to external light or ultraviolet light, the encapsulation is made by a transparent material 31, as shown in FIG. 4. In this modification, a transparent plate 32 preferably made of glass is additionally placed over the transparent encapsulating material 31. Another modification is shown in FIG. 5, in which only a transparent glass plate 32 is utilized to hermetically seal the chip 1 and its electrical connection to the I/O pins 20 within the package. With this structure of using solely the glass plate 32 rather than utilizing it together with the encapsulating resin material, the chip 1 and the wire elements 3 can be no longer restricted by the encapsulating material. This is effective in eliminating the possibility of chip crack or wire break which would be otherwise likely when the chip 1 and the wire elements 3 are in direct contact with the encapsulating material and subjected to thermal strain resulting from the difference n thermal coefficient of expansion between the encapsulating material and the chip 1 or wire elements 3. Further, the chip 1 and the wire elements 3 can be kept free from being attacked by corrosive impurities which may be present in the encapsulating material, improving the reliability of the package.

Figure 6:
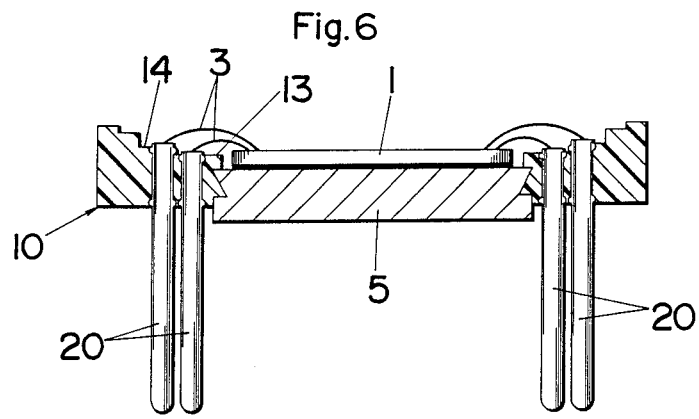
FIG. 6 is a cross sectional view of another modification of the above package.

The glass plate 32 has its periphery rested on stepped shoulder 12 in the top of the package and is secured thereat by a suitable adhesive or any other applicable bonding technique. The transparent plate 32 may be made of transparent resin material including epoxy resins. FIG. 6 shows a further modification of the above embodiment, in which the peripheral portion of the carrier member 10 is formed with outer and inner platforms 13 and 14 of different level. The I/O pins 20 in the outer and inner rows project respectively on the outer and inner platforms 13 and 14 so that the I/O pins 20 in the outer row have their top ends positioned in a level higher than those in the inner row. This contributes to improving the wireability since the wire elements 3 leading to the I/O pins 20 in the outer row can be vertically spaced from those leading to the I/O pins 20 in the inner row, as shown in the figure.

Second embodiment [FIGS. 7 TO 11]

Figure 7:
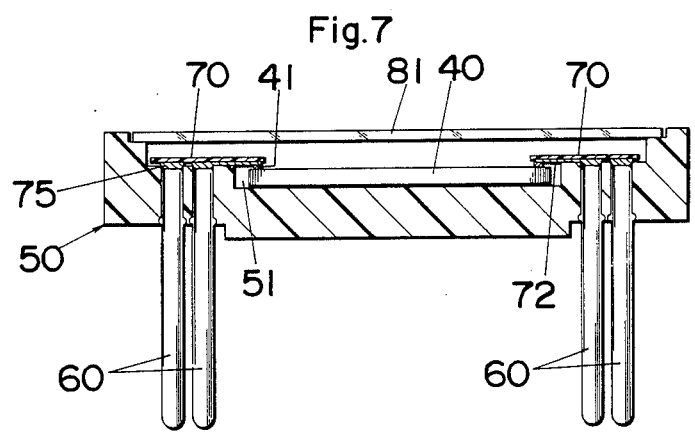
FIG. 7 is a cross sectional view of a plastic chip carrier package in accordance with a second preferred embodiment of the present invention.
Figure 8:
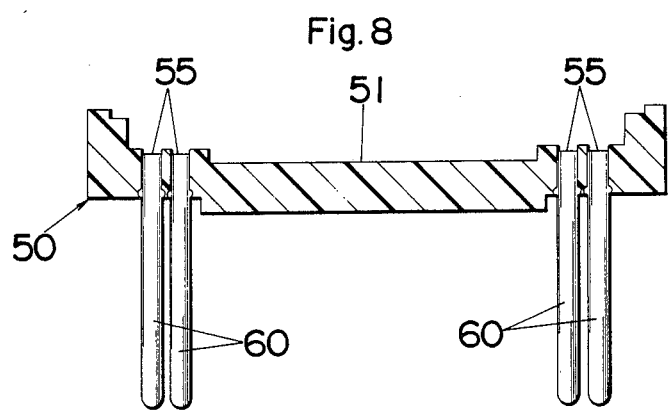
FIG. 8 is a cross sectional view of the package of FIG. 7 before receiving the chip.
Figure 9:
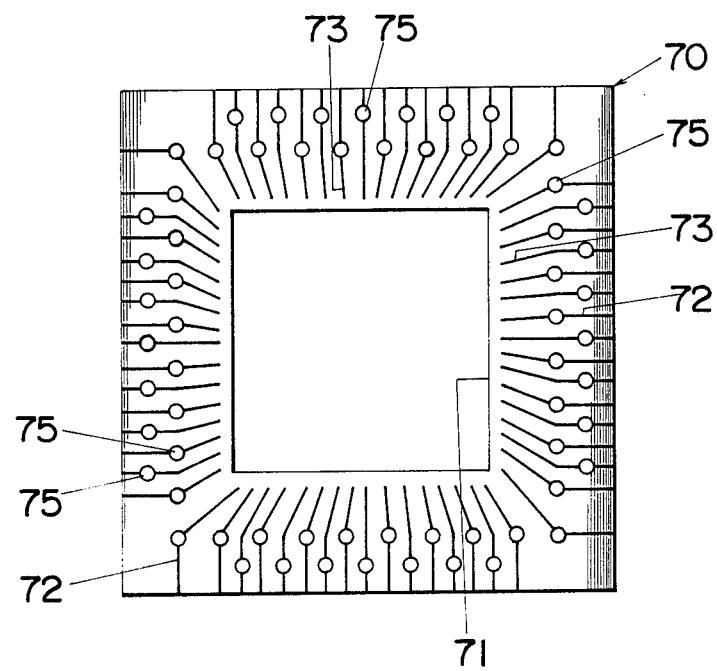
FIG. 9 is a bottom view of a plastic substrate employed in the package of FIG. 7.
Figure 10:
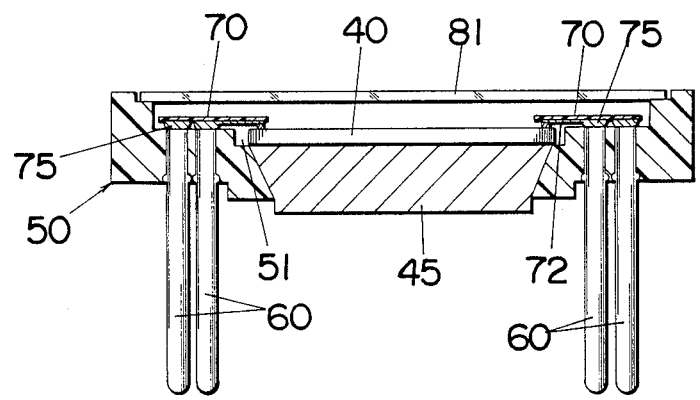
FIGS. 10 and 11 are cross sectional views respectively of modifications of the packages of FIG. 7.

Referring to FIG. 7, there is shown a second embodiment of the present invention which is characterized in that a plastic substrate 70 is utilized for electrical interconnection between a semiconductor chip 40 and a plurality of I/O pins 60. The I/O pins 60, which are molded in a carrier member 50 outwardly of a center recess 51 receiving the chip 40, are likewise arranged on a pin grid as in the previous embodiment to have the staggered pin relation between the outer and inner rows. The I/O pins 60 have their top ends recessed from the top surface of the carrier member 50 so as to provide thereat a corresponding number of solder pits 55, as shown in FIG. 8. The plastic substrate 70 is made from a thermosetting resin such as polyimide or glassfiber reinforced epoxy resin to be in the form of a thin plate or sheet having a center opening 71 smaller than the planar dimension of the chip 40. Deposited on the bottom surface of the plastic substrate 70 is a trace pattern of conductor lines 72, as shown in FIG. 9, which extend from the outer periphery of the plastic substrate 70 and terminate in individual bonding leads 73 with a solder bump spaced evenly along the four sides of the center opening 71. Respectively formed in the conductor lines 72 at the peripheral portion of the plastic substrate 70 are another set of solder bumps 75 which are in registration with the solder pits 55 and the I/O pins 60.

The plastic substrate 70 thus formed is placed over the carrier member 50 so that the solder bumps 75 of the conductor lines 72 fit into the respective solder pits 55 at the same time the bonding leads 73 thereof are in contact with the pads 41 of the chip 40. Subsequently, the package is subjected to reflow soldering for permanent joinder at the respective connections. Since the solder pits 55 receive the respective solder bumps 75 on the conductor lines 72, they serve to easily register the conductor lines 72 with the I/O pins 60 as well as with the pads 41 on the chip 45. Additionally, with the provision of the solder pits 55, the solder bumps 75 received therein undergo melting within the confine thereof so as to be prevented from flowing over the top surface of the carrier member 50 and reaching the adjacent conductor lines 72, thus improving the wireability. It is noted in this connection, the plastic substrate 70 itself is only secured at the soldering connections and is relatively free at the interface with the carrier member 50 so that it can well take up the thermal strain when there is a thermal mismatch between the materials forming the carrier member 50 and the plastic substrate 70. Preferably, the plastic substrate 70 is made from the same thermosetting resin as the carrier member 50. The solder connection between the I/O pins 60 and the conductor lines 72 may be made by providing solder in each of the solder pits 55 or on the top of the I/O pins 60 instead of forming the solder bumps 75 on the conductor lines 72. The package of this embodiment is sealed by a transparent plate 81 of glass or resin which is secured to the top of the carrier member 50 in spaced relation with the chip 40 and the plastic substrate 70 for the same purpose as described with reference to the package of FIG. 5. Although the carrier member 50 with the solder pits 55 is preferable, it may be made without the solder pits 55 as shown in a modification of FIG. 10. In this modification, each of the I/O pins 60 has its top end flush with the top surface of the carrier member 50 and joined to each of the conductor lines 72 by means of a solder bump 75 formed on the conductor line 72. Additionally, the modification incorporates a heat sink 45 molded in the carrier member 50 for mounting thereon the chip 40. The other structures are identical to those in the embodiment of FIG. 7.

Figure 11:
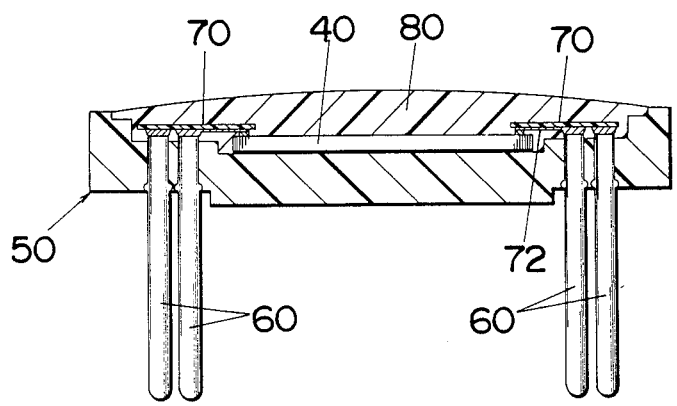

FIG. 11 shows another form of the above modification in which the chip 40 and the plastic substrate 70 are encapsulated by a suitable encapsulating resin material 80. In this modification, the I/O pins 60 are molded in the carrier member 50 with their top end projected above the top surface thereof for electrical connection with the corresponding conductor lines 72 of the plastic substrate 70. Although the previous embodiments disclose the pin grid array comprising only two rows for an illustration purpose, the staggered arrangement of the I/O pins are found to be equally or more effective for the pin grid array of more than two rows, and accordingly the present invention should be understood to include the pin grid array of more than two rows.

What is claimed is:

1. A plastic molded chip carrier package comprising:
   a carrier member made of a plastic material and provided in the center of its top surface with a generally rectangular chip recess for mounting an integrated circuit chip therein, said recess being of substantially the same depth as the thickness of said chip;
   a plurality of I/O pins each having its top end portion embedded into said carrier member radically outwardly of said chip recess and protruding downwardly from said carrier member, said top end portion of each pin being recessed from a top surface of said carrier member so as to form a pit thereat; and
   a plastic substrate mounted on said top surface of the carrier member extending over said chip recess and formed on its bottom surface with a pattern of conductor lines so as to make electrical connection between said chip in said recess and said I/O pins, each of said conductor lines having a conductive bump thereon formed to correspond with a recessed pin in a pit so as to electrically connect a conductive line with a corresponding pin when said substrate rests on said carrier member.

2. A plastic molded chip carrier package as recited in claim 1, wherein said conductive bumps are formed of solder.

3. A plastic molded chip carrier package as recited in claim 1, wherein said I/O pins are arranged in plural rows along the sides of the chip recess in such manner as to be uniformly spaced apart, the pins in each row being staggered with respect to pins in an adjacent row.

4. A plastic mold chip carrier package as set forth in claim 1, wherein said plastic substrate is a thin plate made from a thermosetting resin.

5. A plastic molded chip carrier package as set forth in claim 1, further including a transparent covering material which is placed on the top surface of the carrier member for sealing the chip, the plastic substrate, and the electrical interconnection therebetween.

6. A plastic molded chip carrier package as set forth in claim 1, wherein said transparent covering material is a glass plate spaced from the chip and its electrical connection to the I/O pins.

* * * * *